US008168076B2

(12) United States Patent
Gavillet et al.

(10) Patent No.: US 8,168,076 B2
(45) Date of Patent: May 1, 2012

(54) METHOD FOR PRODUCING A MOULD FOR NANOSTRUCTURED POLYMER OBJECTS

(75) Inventors: Jerome Gavillet, Saint-Egreve (FR); Pierre Juliet, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 397 days.

(21) Appl. No.: 12/588,878

(22) Filed: Oct. 30, 2009

(65) Prior Publication Data

US 2010/0108638 A1 May 6, 2010

(30) Foreign Application Priority Data

Nov. 4, 2008 (FR) ...................................... 08 06143

(51) Int. Cl.
*C03C 15/00* (2006.01)

(52) U.S. Cl. .............. 216/99; 216/37; 216/67; 430/311; 425/28.1; 425/90

(58) Field of Classification Search ................. 216/24, 216/37, 67, 99; 430/311; 425/28.1, 90
See application file for complete search history.

(56) References Cited

U.S. PATENT DOCUMENTS

| 2005/0084804 | A1* | 4/2005 | Truskett et al. ............... 430/311 |
| 2005/0138803 | A1 | 6/2005 | Okawa et al. |
| 2005/0170292 | A1 | 8/2005 | Tsai et al. |
| 2008/0128656 | A1 | 6/2008 | Thollon et al. |
| 2008/0220109 | A1 | 9/2008 | Ito et al. |

FOREIGN PATENT DOCUMENTS

| DE | 10 2008 009 035 A1 | 9/2008 |
| EP | 1 884 505 A1 | 2/2008 |
| WO | WO 2006/070130 A2 | 7/2006 |

OTHER PUBLICATIONS

French Search Report issued Jun. 18, 2009.

* cited by examiner

*Primary Examiner* — Nadine Norton
*Assistant Examiner* — Maki Angadi
(74) *Attorney, Agent, or Firm* — Oliff & Berridge, PLC

(57) ABSTRACT

A mould for objects made of polymer material is produced by successively depositing a barrier thin layer and a thin layer of diamond-like carbon on at least a part of a metal support. The thin layer of diamond-like carbon is then nanopatterned with a predetermined pattern presenting a form factor of more than 1. Nanopatterning is performed by selective chemical etching in dry phase through a hard mask and etching stops at an interface between the thin layer of diamond-like carbon and the barrier thin layer. The hard mask used was formed beforehand on a free surface of the thin layer of diamond-like carbon by selective chemical etching in dry phase performed through a void lattice delineated by nanoparticles deposited beforehand on a free surface of said hard mask. The barrier thin layer and the nanopatterned thin layer of diamond-like carbon form a bilayer coating presenting a thickness comprised between about 100 nm and about 10 μm.

11 Claims, 4 Drawing Sheets

METHOD FOR PRODUCING A MOULD FOR NANOSTRUCTURED POLYMER OBJECTS

BACKGROUND OF THE INVENTION

The invention relates to a method for producing a mould for objects made of polymer material.

STATE OF THE ART

Polymer materials are widely used for producing current consumer goods. Such materials in fact enable numerous products to be produced in very large quantities at low cost, for example in the packaging field or components in the automobile, mobile phone, medical instrument, and renewable energy fields . . . . In general, the objects are produced using conventional manufacturing methods in the plastics processing field. In particular, they can be produced by moulding either by means of a plastic injection method or by means of a drawing method. The plastic injection method involves melting of the polymer material in a mould whereas drawing corresponds to thermoforming of the polymer material performed using a mould (also called die) at a lower temperature than the melting temperature of the polymer material.

Polymer materials have also been used for the last few years in niche markets for which the quantities produced are smaller but the requirements in terms of manufacturing method, quality and functionality are greater. This is for example the case in the field of production of microfluidic devices, bio-chips, holograms and such like. These kinds of particular fields require production of miniaturized objects of very great precision as far their shape and size are concerned. In particular, the surface of these objects is in general patterned, i.e. it comprises a pattern defined by lands and hollow zones and the dimensions of these areas (width, height, pitch) are in the region of the micrometer and increasingly in the region of the nanometer. In the latter case, the surface is said to be a nanopatterned surface.

Furthermore, these miniaturized objects with high added value are beginning to be used in the more traditional markets of current consumer goods which require production of large volumes and low manufacturing costs.

Thus, for this type of market, the current issue is to be able to use conventional manufacturing methods in the plastics processing field (injection or drawing moulding), which are methods that are easy to industrialize and profitable, while at the same time mastering the complexity, dimensions and surface state of the manufactured objects. In particular, the issue consists in obtaining polymer objects presenting nano-patterned surfaces corresponding perfectly to the complementary part of the surface of the mould used in these manufacturing methods.

For example purposes, optic data recording disks such as CD-Rom are produced by forming a track presenting a pattern having a size under the micrometer in a polymer substrate for example made from polycarbonate. Such disks are however generally produced in large quantity by an injection moulding process using a mould or a die support also called master disk or stamper. One of the free surfaces of the stamper is patterned in complementary form to the predetermined pattern required for the disks. In general, the metal stamper designed to act as mould when manufacturing optic disks by injection moulding is in general obtained from a previously patterned original model.

The durability, upkeep, maintenance and ageing of the moulds used and more particularly of their surfaces are key factors for ensuring lasting quality of the objects produced. All these constraints are however even more limiting when scaling down from the macro- or microscopic scale to the nanoscopic scale. The mould take-out phase is also one of the crucial steps of the manufacturing process, for this phase plays an important role in productivity of the polymer objects produced. This phase can in fact generate a large number of scrap items if there is a poor reproducibility of the surface of the mould or scratches on the surface of said mould etc. It can also disturb the manufacturing process, for example in case of fouling due to possible sticking of the polymer in the mould.

At present, formation of a nanopatterned surface for metal moulds can be achieved by forming a nanostructure by electron beam lithography and then placing this nanostructure on the surface of a metal film. The nanostructure created by electron beam lithography can also act as hard mask for etching a nanopattern in a substrate that will form the mould. The electron beam lithography technique is however long and very costly. Furthermore, it is only suitable for particular applications for which the organization of the patterns is of major importance, in particular in the optic and electronic fields. Alternative approaches are currently being considered for nanopatterning a mould at lower cost. It has already been proposed to micro- or nano-pattern aluminum foil sheets by anodizing in order to use them as moulds for producing polyolefin objects.

Patent application US2005/0084804 describes the use of an anti-adhesive layer of diamond-like carbon for producing a mould designed to receive a reticulated polymer material. The layer of diamond-like carbon, also called DLC, is deposited on a main support and is patterned by reactive dry etching in oxygen to achieve a patterned surface. In a particular embodiment, a layer of electrically conductive material, for example indium and tin oxide (ITO), can be deposited between the main support and the DLC layer.

OBJECT OF THE INVENTION

The object of the invention is to propose an easy-to-implement and low-cost production method of a mould having an improved lifetime and enabling nanopatterned objects to be produced from a polymer material in dependable and precise manner. According to the invention, this object is achieved by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
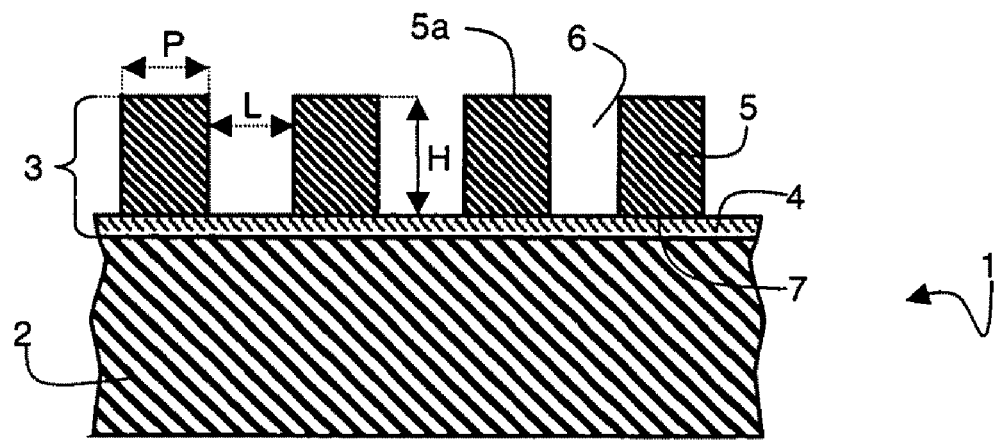
FIG. 1 schematically represents a particular embodiment of a mould according to the invention, in cross-section.
Figure 2:
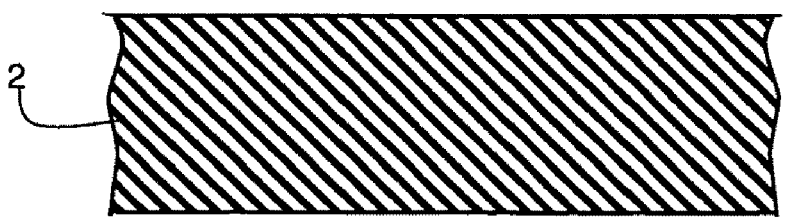
FIGS. 2 to 9 schematically represent different steps of a particular method for producing the mould according to FIG. 1, in cross-section.
Figure 3:
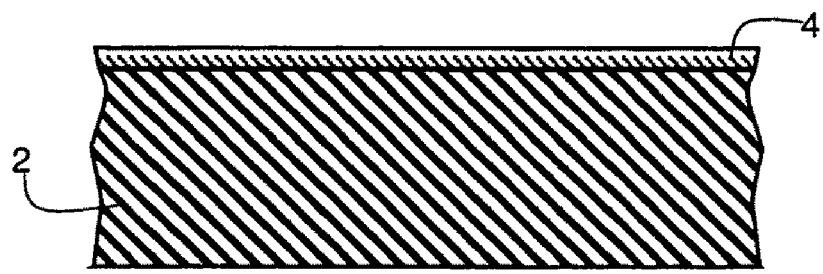

FIG. 1 illustrates a particular embodiment of a mould 1 suitable for producing objects formed by a polymer material and presenting a nanopatterned surface, by moulding (for example by plastic injection or by drawing moulding).

Mould 1 comprises a metal support 2 which forms the main part of the mould and in particular ensures the strength of mould 1. The metal support is for example formed by a metallic material or alloy such as aluminum, steel, brass etc.

Furthermore, a coating 3 formed by two superposed thin layers at least partly covers a surface of metal support 2. Such a coating enables mould 1 to be provided with a nanopatterned surface designed to be placed in contact with a polymer material when objects are produced from polymer material.

Coating 3, also called bilayer coating, is thus formed by a barrier thin layer 4 in contact with metal support 2 and whereon a thin nanopatterned layer 5 of diamond-like carbon (DLC or amorphous diamond-like carbon) is arranged. The coating further has a thickness comprised between about 100 nm and about 10 µm.

Barrier thin layer 4 in particular enables nanopatterning of the DLC thin layer to be performed during production of mould 1 without damaging metal support 2. It can for example be made from hydrogenated silicon carbide. This material also enables optimum adhesion to be ensured between the DLC layer and the inorganic material of mould 1. In this case, barrier thin layer 4 advantageously has a thickness comprised between 50 nm and 500 nm.

Barrier thin layer 4 can also be made from chromium nitride. In this case, it advantageously has a thickness comprised between 50 nm and about 500 nm. Thin layer 4 of chromium nitride then acts not only as physical barrier when nanopatterning of DLC thin layer 5 is performed, but as chromium nitride is a material with a low coefficient of friction, barrier thin layer 4 also enhances the ease of take-out from the mould.

DLC thin layer 5 is thus more particularly nanopatterned with a predefined pattern forming the nanopatterned surface of mould 1. Such a pattern corresponds more particularly to the complementary part of the pattern required for the polymer material objects produced using mould 1. The form of the pattern is consequently determined by that required for the pattern of the polymer material objects. In particular, in FIG. 1, the pattern is formed by a plurality of openings 6 formed in DLC thin layer 5 and passing through said thin layer 5 from the free surface 5a to the interface 7 between thin layer 5 and barrier thin layer 4.

The pattern further presents nanometric dimensions, i.e. hollow zones with respect to the rest of DLC thin layer 5 with a height and width of nanometric dimensions and therefore advantageously comprised between about 5 nm and about 500 nm. In particular, the form factor, i.e. the mean ratio between the height and width of the hollow zones of said pattern is at least greater than 1. The pattern thus presents hollow zones having a height (or depth) that is greater than their width. Such a high form factor greater than 1 is in particular required for polymer material objects presenting a self-cleaning surface, for example in the field of the new generations of mobile phones.

Thus, in FIG. 1, for each opening 6, the ratio between height H of opening 6 and width L of opening 6 is greater than 1. H also corresponds, in FIG. 1, to the thickness of DLC thin layer 5. For example, each opening 6 can have a height H equal to 50 nm and a width L equal to 20 nm and can be separated from an adjacent opening by a pitch of 50 nm.

Such a mould 1 presents the advantage of integrating a nanopatterned surface designed to be transferred negatively by moulding to the polymer material objects produced. Nanopatterning the tool rather than the polymer material objects thereby enables the objects to be produced in dependable and precise manner.

Nanopatterning is moreover not directly performed here in the metal support which in general forms mould 1 in the state of the art. It is on the contrary performed in a coating of micrometric dimensions covering the metal support. Nanopatterning is more particularly performed in a thin layer of DLC whereas a barrier thin layer is arranged between said thin layer of DLC and the metal support to protect the metal support when nanopatterning is performed. This also contributes to improving the dependability and precision of the polymer material objects produced.

Nanopatterned thin layer arranged on metal support furthermore corresponds to a functional and recyclable sacrificial layer. The cycle and lifetime stresses of the mould are thus transferred from the metal support to this sacrificial layer which is less expensive to produce than the metal support if the latter was nanopatterned.

Finally, the choice of diamond-like carbon (DLC) to produce nanopatterned thin layer 5 is particularly advantageous in so far as DLC is not only a material with a low friction coefficient which facilitates the take-out step when producing polymer material objects while at the same time being able to be easily and economically nanopatterned. In addition, the patterns made in a DLC layer can have various possible shapes. Such a mould thereby enables the best possible trade-off to be had between technical feasibility for producing nanopatterned objects from polymer material and economic feasibility.

In particular FIGS. 2 to 9 illustrate the different steps of producing a mould 1 according to FIG. 1 and more particularly nanopatterning of the DLC thin layer.

Figure 4:
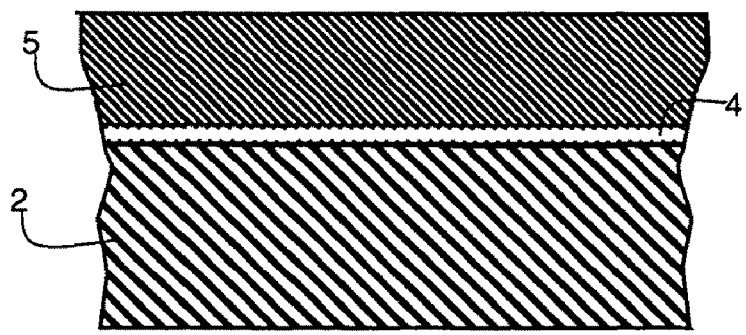

Barrier thin layer 4 is thus previously deposited on metal support 2. Then, as represented in FIG. 4, a DLC thin layer 5 is deposited on the free surface of barrier thin layer 4. At this stage of the process, DLC thin layer 5 is not yet nanopatterned. Thus, in FIG. 4, it is in the form of a thin layer of constant thickness covering the whole of the free surface of barrier thin layer 4.

Thin layers 4 and 5 can for example be deposited by physical vapor deposition (PVD) or by chemical vapor deposition (CVD) using at least one organometallic precursor.

Layers 4 and 5 can for example by deposited by a low frequency (40 kHz) plasma enhanced CVD method. A layer 4 of amorphous silicon carbide is made from a mixture of $C_4H_{12}Si$ and argon (50%-50%) with an inter-electrode space of 200 mm, a plasma power density of 0.10 W/cm$^2$, a gas pressure of 4 Pa and a temperature of less than 150° C. DLC layer 5 is made from a mixture of $C_4H_{12}$ and hydrogen (80%-20%), with an inter-electrode space of 200 mm, a plasma power density of 0.32 W/cm$^2$, a gas pressure of 4 Pa and a temperature of less than 150° C. The thickness of layers 4 and 5 is moreover determined by the deposition time of each layer.

Then, as represented in FIGS. 5 to 9, DLC thin layer 5 is nanopatterned by means of a nanopatterned hard mask 8 formed on the free surface of DLC thin layer 5.

Figure 5:
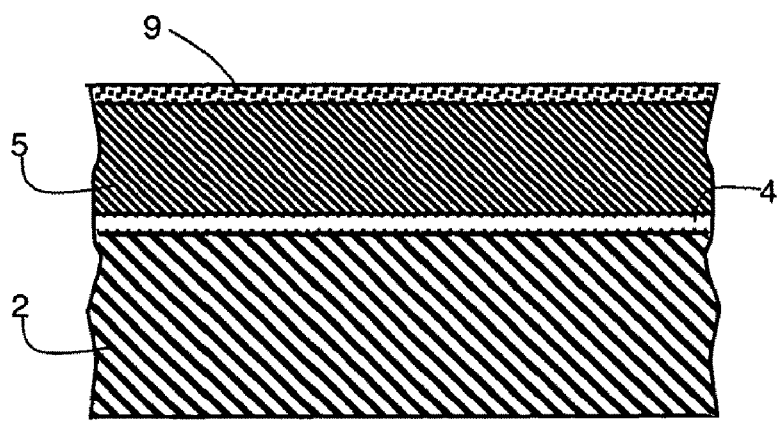
Figure 6:
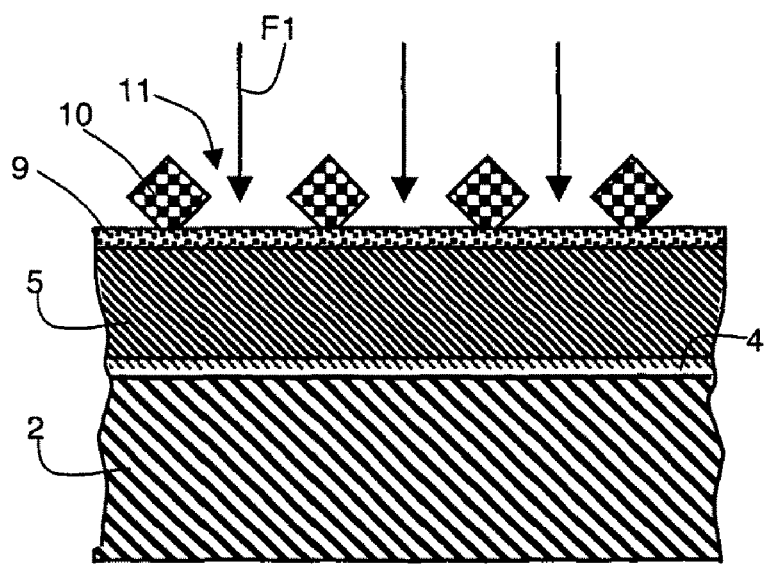
Figure 7:
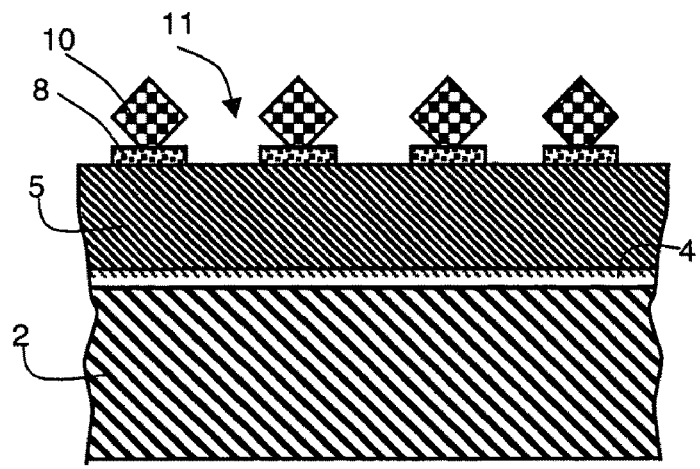

Hard mask 8 is more particularly achieved by depositing a thin film 9 on the whole of the free surface of said DLC thin layer 5 (FIG. 5). Thin film 9 presents a constant thickness which is preferably comprised between 10 nm and 50 nm. Furthermore, thin film 9 is formed by a material able to form a hard mask suitable for nanopatterning DLC thin layer 5. Such a material is advantageously chosen from silicon oxide, hydrogenated silicon carbide, silicon nitride, a metallic material such as aluminum, copper, chromium, and a metallic nitride such as chromium nitride etc. Thin film 9 is for example deposited by PVD or by CVD.

Such a hard mask 8 presents the advantage of being a sacrificial layer able to be removed chemically once DLC thin layer 5 has been nanopatterned. In addition, the same material as that used for producing barrier thin layer 4 can advantageously be used to produce hard mask 8. This then enables the step of removing hard mask 8 to be simplified. For example, when barrier thin layer 4 is made from hydrogenated silicon carbide, this material can also be used to produce thin film 9 and therefore hard mask 8.

Nanoparticles 10, i.e. particles of nanometric dimensions, are then deposited on the free surface of said thin film 9 (FIG. 6) in such a way that they delineate a void lattice 11. Void lattice 11 can be organized or not. The nano-particles in particular have a mean size of less than 200 nm. They can be deposited by any type of suitable method depending on the type of pattern (shape, dimensions etc.) required for hard mask 8 and therefore for the type of pattern required for DLC thin layer 5. For example, the nanoparticles can be deposited by:
- a magnetron sputtering technique associated with condensation of the vapor in the form of aggregates in a high-pressure stage and with mass sorting of these aggregates before deposition on the free surface of thin film 9. For example purposes, the MANTIS corporation markets this type of equipment under the name "Nanocluster Deposition".
- a CVD method assisted by liquid injection (Such a method is for example described in International Patent application WO-A-2006/070130).
- a deposition technique of the Langmuir-Blodgett type enabling transfer of a monolayer of nanoparticles from a liquid bath to the free surface of thin film 9 by immersion followed by controlled removal from the latter. The NANOMETRIX corporation markets this type of equipment under the name "Driven Monolayer Assembly Process" or "DMA" process.

The choice of the method used depends more particularly on the type of pattern required for the hard mask. The method used does in fact determine the type of materials constituting nanoparticles 10, their mean size and the type of void lattice formed.

The deposition technique by magnetron sputtering thus enables deposition of nanoparticles of a metal chosen from silver, gold, palladium, platinum, copper, titanium, zirconium, etc or of a metal alloy or compound such as titanium oxide or zirconium oxide, or silicon or one of its compounds such as silicon carbide, silicon oxide and silicon nitride. Nanoparticles 10 in particular have a mean size comprised between about 1 nm and about 10 nm with a void lattice 10 presenting a low organization level.

The CVD assisted by liquid injection technique for its part enables nano-particles of iron oxide or of a metal such as silver, platinum and copper etc to be deposited. The nanoparticles have a mean size comprised between about 1 nm and, about 50 nm with a void lattice 10 presenting a low organization level.

Finally, with the Langmuir-Blodgett method, the deposited nanoparticles 10 can be nanoparticles of a material chosen from silicon carbide, silicon oxide, silicon nitride, a polymer material, titanium oxide and zirconium oxide in silicon oxide or in polymer, and they have a mean size of less than 500 nm and are moreover deposited with a very high organization level.

Figure 10:
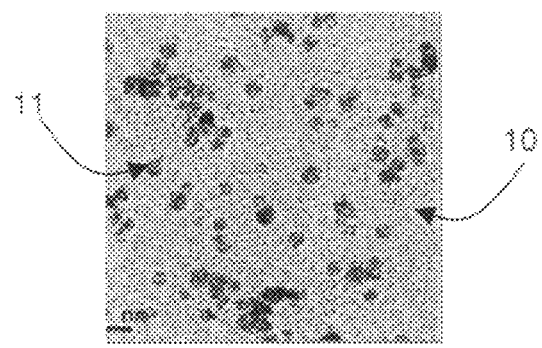
FIGS. 10 to 12 are snapshots obtained by scanning electron microscopy of different assemblies of nanoparticles able to be deposited on the surface of the hard mask in a particular method for producing a mould.
Figure 11:
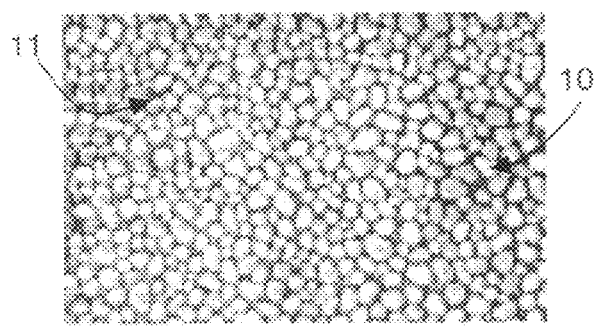
Figure 12:
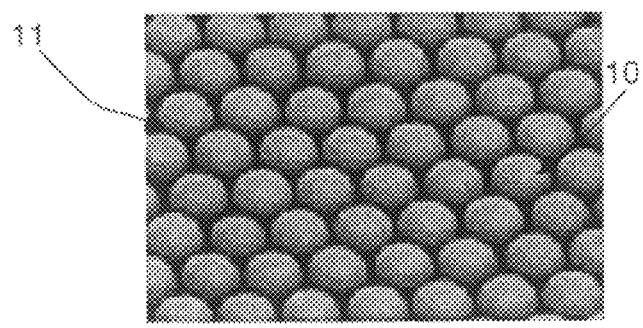

For example purposes, FIGS. 10 to 12 respectively represent snapshots obtained by scanning electron microscopy of nanoparticles deposited according to the three deposition methods referred to above. Thus, nano-particles 10 in FIG. 10 are nanoparticles of gold and palladium alloy deposited by magnetron sputtering and having a mean size of 1, 3 or 5 nm. In FIG. 11, nanoparticles 10 of silver were deposited by a liquid injection CVD method. They have a mean size of 50 nm. Finally, nanoparticles 10 of FIG. 12 deposited by the Langmuir-Blodgett method are silicon oxide and have a mean size of 50 nm. In each of snapshots 10 to 12, the presence of a void lattice 11 can be observed delineated by nanoparticles 10 and through which the opening of hard mask 8 will be able to be made.

Once nanoparticles 10 have been deposited on the surface of thin film 9, a selective dry-phase chemical etching operation is performed through void lattice 11 created. This operation is represented schematically by arrows F1 in FIG. 7. It then enables thin film 9 to be nanopatterned thereby enabling hard mask 8 to be formed. In particular, etching enables the parts of thin film 9 not covered by nanoparticles 10 to be eliminated. These parts correspond more particularly to the free parts of thin film 9.

Dry phase chemical etching is in particular selective with respect to the material forming thin film 9. The chemical component used for performing the chemical etching operation thereby enables thin film 9 to be etched more quickly than DLC thin layer 5. For example, plasma chemical etching using a fluorinated compound enables a thin film 9 of (hydrogenated) silicon carbide or oxide to be etched more quickly than nanoparticles 10 which are made from metal, metal alloy or polymer (the etching selectivity of thin film 9 with respect to nanoparticles 10 is typically more than 10 for 1 also noted 10:1), and more quickly than DLC thin layer 5 (the etching selectivity of thin film 9 with respect to DLC is typically more than 10:1).

For example purposes, nanopatterning of hard mask 8 can be performed on industrial equipment of the NEXTRAL NE110 type with a throughput of 2 Ncm$^3$/min of $SF_6$ and 20 Ncm$^3$/min of $CHF_3$, a plasma power of 20 Watts, a polarization of 300 V and a pressure of 50 mT.

Figure 8:
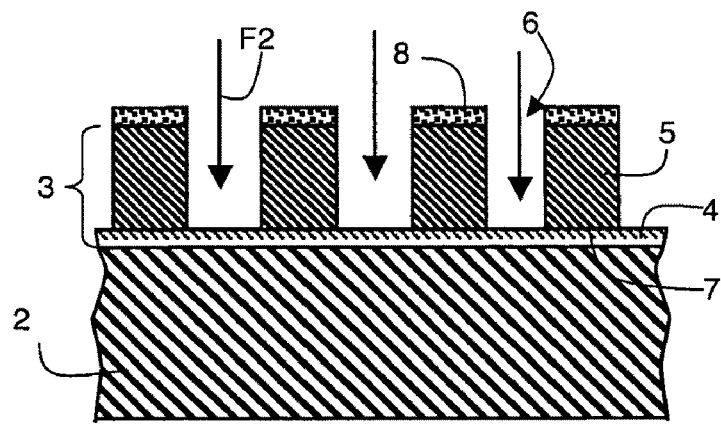

A selective dry-phase chemical etching operation, represented schematically by arrows F2 in FIG. 8, is then performed through hard mask 8 to make openings 6 in DLC thin layer 5 and thereby form the predetermined pattern in nanopatterned DLC thin layer 5.

At this stage, chemical etching is selective in so far as it enables the diamond-like carbon to be etched chemically without etching the material forming hard mask 8 or that forming barrier thin layer 4. In particular, etching of DLC thin layer 5 is quicker than that of hard mask 8. Thus, an oxygen plasma gives a selectivity of 22 for 1 (22:1) between the DLC and a hard mask 8 made from (hydrogenated) silicon carbide or oxide. This enables the use of a very thin hard mask (for example with a thickness of about 10 nm) to be envisaged, which presents the advantage of performing nanopatterning of the hard mask very quickly (i.e. obtaining a very small opening time of hard mask 8), which is compatible with the lifetime of the pattern in plasma exposure (physical etching of the pattern under the effect of ion bombardment). The etching time of DLC layer 5 is relatively longer than that of the opening time of mask 8, which enables the parts of the DLC layer not covered by hard mask 8 to be physically eliminated. Etching of DLC thin layer 5 through mask 8 can also be performed on industrial equipment of the NEXTRAL NE110 type with a throughput of 80 Ncm$^3$/min of oxygen, a plasma power of 10 Watts, a polarization of 320 V and a pressure of 20 mT.

Figure 9:
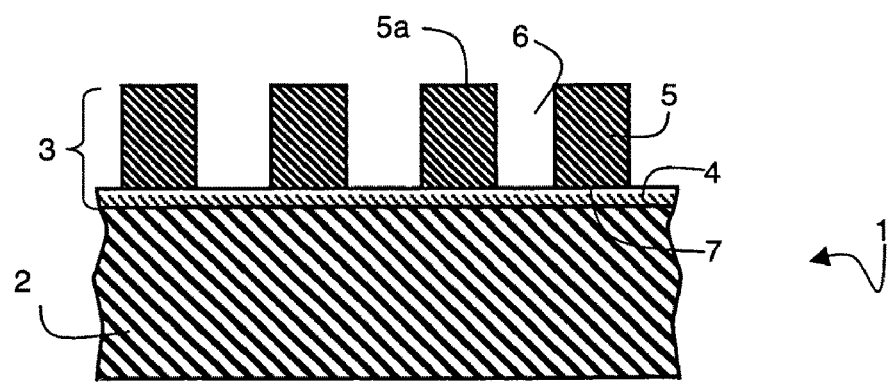

Etching is furthermore stopped by barrier thin layer 4. Openings 6 formed in DLC thin layer 5 are therefore pass-through from the free surface of DLC thin layer 5 to interface 7 between thin layers 4 and 5. Mould 1 is then obtained after hard mask 8 has been removed (FIG. 9). Removal of hard mask 8 is for example achieved by an etching operation similar to that used for etching thin film 9 and opening hard mask 8.

It should be noted that nanoparticles 10 being of small size and of small mass, they are weakly bonded to the surface of thin film 9. They are progressively and completely removed from the surface of hard mask 8 under the effect of the ion bombardment inherent to the different selective chemical etching operations in dry phase. It is therefore important to control the etching time to open hard mask 8 in order not to eliminate nanoparticles 10 during this etching step. The etching time of hard mask 8 is in general very short on account of the hard mask being very thin. This consequently explains why nanoparticles 10 can not be used directly as mask for nano-patterning DLC thin layer 5. They would be eliminated before DLC thin layer 5 is nanopatterned over its whole thickness. The use of nanoparticles 10 also enables DLC thin layer 5 to be hardly affected by the etching step of thin film 9 designed to open hard mask 8. Nanoparticles 10 are then completely eliminated during the etching step of DLC thin layer 5 and if necessary during removal of hard mask 8.

Formation of bilayer coating 3 on metal support 2 may be localized on a part of the surface of metal support 2 only. In this case, the method for producing mould 1 can comprise additional steps enabling deposition and then nano-patterning of the bilayer coating to be localized. The deposition step of layers 4 and 5 can thus be preceded by a deposition step of a photoresist layer on the surface of metal support followed by a photolithography operation. The photolithography operation enables openings to be created in the photoresist layer designed to delineate the areas where thin layers 4 and 5 will be deposited. The photoresist layer is removed after creation of hard mask 8, for example by an operation called lift-off.

Production of mould 1 according to the method described in FIGS. 2 to 9 and more particularly nanopatterning of the DLC thin layer present the advantage of being easy to implement at low cost while at the same time guaranteeing that a quality mould is obtained. Moreover, nanopatterned DLC thin layer can easily be removed when this proves necessary by cleaning the DLC with an oxygen plasma. A new nano-patterned DLC thin layer can then redeposited by repeating the different steps of the method represented in FIGS. 4 to 9.

Such a mould can advantageously be used for producing nanopatterned objects from polymer material used in numerous fields: solar cells in the photovoltaic field, antireflection dashboards presenting nanotextures in the automobile field, holograms in the labelling field to improve traceability and prevent patent infringements, objects presenting self-cleaning and super-hydrophobic surfaces, and so on. Furthermore, such a mould can also be used for its abilities to reduce the defect rate on polymer objects, which are contamination sources, and chemical mould take-out and cleaning consumables, in fields such as:
- drawing of micro/nano-patterned optic concentrators for photovoltaic applications
- injection of nanostructures for applications in the automobile field (anti-reflection and self-cleaning),
- drawing of the next generation of safety components,
- production of biologically active surfaces against adhesion of bacteria/proteins or for cell growth,
- production of iso-porous membranes.

We claim:

1. A method for producing a mould for objects made of polymer material comprising the following steps:
    successive deposition of a barrier thin layer and a diamond-like carbon thin layer on at least a part of a metal support,
    and nanopatterning of the diamond-like carbon thin layer to form at least a nanopatterned surface designed to come into contact with said polymer material,
    wherein the diamond-like carbon thin layer is nanopatterned with a predefined pattern presenting a form factor of more than 1 by performing the following successive steps:
    formation, on a free surface of said diamond-like carbon thin layer, of a hard mask formed by a first dry-phase selective chemical etching operation through a void lattice delineated by nanoparticles deposited beforehand on a free surface of said hard mask,
    and formation of the predefined pattern in the diamond-like carbon thin layer by a second dry-phase selective chemical etching operation through the hard mask, the second dry-phase selective chemical etching operation stopping at an interface between the diamond-like carbon thin layer and the barrier thin layer,
    and wherein the barrier thin layer and the nano-patterned diamond-like carbon thin layer form a bilayer coating presenting a thickness comprised between about 100 nm and about 10 µm.

2. The method according to claim 1, wherein the hard mask is formed by a material selected from the group consisting of silicon oxide, hydrogenated silicon carbide, silicon nitride, aluminum, copper, chromium and a metal nitride.

3. The method according to claim 1, wherein the hard mask has a thickness comprised between about 10 nm and about 50 nm.

4. The method according to claim 1, wherein the nanoparticles are nanoparticles of a material selected from the group consisting of silver, gold, palladium, platinum, copper, titanium, zirconium, titanium oxide, zirconium oxide, silicon, silicon carbide, silicon oxide and silicon nitride and wherein they are deposited by a magnetron sputtering method.

5. The method according to claim 1, wherein the nanoparticles are nanoparticles of an iron oxide or of a metal selected from the group consisting of silver, platinum and copper and wherein they are deposited by chemical vapor deposition assisted by liquid injection.

6. The method according to claim 1, wherein the nanoparticles are nanoparticles of a material selected from the group consisting of silicon carbide, silicon oxide, silicon nitride, a polymer material, titanium oxide and wherein zirconium oxide and they are deposited by a Langmuir-Blodgett type method.

7. The method according to claim 1, wherein the predefined pattern is formed by a plurality of openings passing through the diamond-like carbon thin layer from a free surface to the interface between said diamond-like carbon thin layer and the barrier thin layer.

8. The method according to claim 1, wherein the barrier thin layer is made from chromium nitride.

9. The method according to claim 1, wherein the barrier thin layer is made from hydrogenated silicon carbide.

10. The method according to claim 8, wherein the barrier thin layer has a thickness comprised between 50 nm and 500 nm.

11. The method according to claim 1, wherein the metal support comprises a metal material selected from the group consisting of aluminum, steel and brass.

* * * * *